(12) United States Patent
Chen

(10) Patent No.: US 9,838,006 B2
(45) Date of Patent: Dec. 5, 2017

(54) SWITCH MODULE OF PHOTOELECTRIC INTEGRATED MECHANICAL SHAFT KEYBOARD

(71) Applicant: DONG GUAN LONGIDEAL INDUSTRIAL CO., LTD, Guangdong (CN)

(72) Inventor: Zhongfeng Chen, Guangdong (CN)

(*) Notice: Subject to any disclaimer, the term of this patent is extended or adjusted under 35 U.S.C. 154(b) by 0 days.

(21) Appl. No.: 15/124,681

(22) PCT Filed: Mar. 27, 2015

(86) PCT No.: PCT/CN2015/075304
§ 371 (c)(1),
(2) Date: Sep. 9, 2016

(87) PCT Pub. No.: WO2016/134560
PCT Pub. Date: Sep. 1, 2016

(65) Prior Publication Data
US 2017/0019102 A1  Jan. 19, 2017

(30) Foreign Application Priority Data

Feb. 27, 2015 (CN) .......................... 2015 1 0090322
Feb. 27, 2015 (CN) ..................... 2015 2 0118887 U

(51) Int. Cl.
| | | |
|---|---|---|
| *H03K 17/94* | (2006.01) | |
| *H03K 17/78* | (2006.01) | |
| *H03K 17/969* | (2006.01) | |
| *H03K 17/96* | (2006.01) | |
| *G02B 19/00* | (2006.01) | |

(52) U.S. Cl.
CPC ........... *H03K 17/78* (2013.01); *H03K 17/969* (2013.01); *H03K 17/9629* (2013.01); *G02B 19/009* (2013.01); *G02B 19/0061* (2013.01)

(58) Field of Classification Search
CPC ...................................................... H03K 17/78
See application file for complete search history.

(56) References Cited

U.S. PATENT DOCUMENTS

| | | | | |
|---|---|---|---|---|
| 2004/0027561 | A1* | 2/2004 | Takahashi | G01B 11/26 356/152.2 |
| 2012/0306751 | A1* | 12/2012 | Massaro | G06F 3/0219 345/168 |
| 2015/0061901 | A1* | 3/2015 | Casparian | H01H 13/705 341/22 |

FOREIGN PATENT DOCUMENTS

CN        2301752 Y        12/1998

* cited by examiner

*Primary Examiner* — Amine Benlagsir
(74) *Attorney, Agent, or Firm* — Prakash Nama; Global IP Services, PLLC

(57) ABSTRACT

A switch module of a photoelectric integrated mechanical shaft keyboard, having a casing and a key cap a driving device, a photoelectric switch, a movable optical module and a fixed optical module. The photoelectric switch has a PCB, an SMD IR integrated on the PCB and an SMD PT tube. By pressing down the key cap, the driving device drives the movable optical module to move up and down to control the relative positions of the movable optical module and the fixed optical module. When light emitted by the SMD IR tube is coupled into the SMD PT tube, an optical path is connected, so that the photoelectric switch is turned on; and when the light emitted by the SMD IR tube cannot be coupled into the SMD PT tube, the optical path is disconnected, so that the photoelectric switch is turned off.

14 Claims, 13 Drawing Sheets

SWITCH MODULE OF PHOTOELECTRIC INTEGRATED MECHANICAL SHAFT KEYBOARD

BACKGROUND OF THE INVENTION

The present invention relates to a switch module used for a keyboard of a character input system (such as a computer input system), in particular to a switch module of a photoelectric integrated mechanical shaft keyboard for character input.

Keyboards are roughly divided into five kinds according to a switch (commonly known as the switch control principle or shaft), which are a membrane keyboard, a conductive rubber type keyboard, a contactless electrostatic capacity type keyboard, a mechanical keyboard and a photoelectric keyboard respectively. The membrane keyboard is generally internally provided with three membranes, the upper membrane is an anode circuit, the middle membrane is an interval layer, and the lower membrane is a cathode circuit. The working principle is that a mechanical module is pressed down by knocking on a key cap, so that the upper membrane and the lower membrane can be in contact and be electrified to finish the connection, and thus the keyboard is referred to as the membrane keyboard. The membrane keyboard has the main defects that the keyboard is short in service life, the membranes abrade easily, and reaction delay occurs; besides, since the keyboard is small in size, the intervals between keys are small, a man-computer function is relatively poor, the keyboard is not very good in touch when operated, and users feel tired in their hands after the keyboard is operated for a long time. The conductive rubber type keyboard and the contactless electrostatic capacity type keyboard are seldom available in the market due to cost and technology reasons, and are almost limited to a television remote control and a gamepad.

The mechanical keyboard is the mainstream of the present computer keyboard market. The working principle of the mechanical keyboard is that the bottom of the keyboard is provided with a circuit board, and more than 100 mechanical shafts are fixed to the circuit board; each shaft is an independent switch, and by pressing down the mechanical shafts, signals are transmitted to the computer through the circuit board. The mechanical keyboard is excellent in performance, reacts sensitively, is good in touch and meets the requirements of office workers and game players. However, the pure mechanical keyboard has the shortcomings that first the pure mechanical shaft switch performs contact or non-contact motion through a metal contact type spring piece to close or open the circuit; the mechanical contact type structure is easily subject to fatigue damage, spring piece contacts abrade easily, so that the switch control failure or misoperation control occurs, and the service life of the product is not long enough; second the metal spring piece and the contacts are easily affected by the usage environment to lead to oxidation and aging, poor connection contact is caused, and the switch control failure or misoperation control occurs; third welded pins of the pure mechanical shaft switch structure are of a direct insert type structure and need to be inserted into a printed circuit board (PCB) manually, and then the welded pins are welded and cut; in the welding production process, the welded pins are not in place easily when inserted, which leads to processes such as reworking maintenance; the production operation process is complex and is unsuitable for automatic welded pin insertion, occupied labor is high, the production efficiency is low, and the manufacturing cost is high, fourth direct insert type light-emitting diodes (LEDs) are adopted for a key cap character lighting system of the pure mechanical shaft switch structure, the LEDs also need to be inserted into the PCB manually through plenty of labor and then are welded and cut; the production operation process is complex and unsuitable for automatic welded pin insertion, the material cost is high, the production efficiency is low, and the manufacturing cost is high.

The photoelectric keyboard is an emerging keyboard in recent years. A novel photoelectric induction recognition technology is added to the photoelectric keyboard based on a conventional mechanical key shaft technology, and some problems occurring to the conventional contact type mechanical switch are solved by replacing the conventional contact poking pieces with optical induction modules. The optics principle and the photocoupling technology are utilized for the photoelectric keyboard; an optical access is formed by a light-emitting element and a light-receiving element, a light-blocking part triggers an optical coupler in the optical path connection or disconnection process to change the circuit resistance value to perform circuit closing or opening, so that the electricity-light-electricity conversion is achieved, and the switch is controlled to be turned on or turned off; besides, light and electricity are isolated from each other between input and output. Compared with other keyboards, the photoelectric keyboard has the following advantages. 1. A novel shaft is adopted for the optical axis keyboard, the optical axis keyboard has a longer service life than an ordinary membrane keyboard, the theoretical service life is infinite, and the optical axis keyboard can be used for 50000 hours in a continuous power-on state. 2. After the optical axis keyboard is used for a long time, the key touch changes are very small, which cannot be achieved in the membrane keyboard and the ordinary mechanical keyboard. 3. More than 104 keys of the optical axis keyboard can be conflict-free (therefore, the optical axis keyboard is very suitable for game players and most of professional electronic sports players use the conflict-free key keyboard to improve their level). 4. You can replace key caps yourselves, and do it yourself (DIY) conveniently; 5. The part of an optical axis lower cover guide groove, which is in contact with a pressing handle guide pillar, is widened, and a die mirror plane manufacturing process is used, so that the product is subject to smaller friction, has better abrasion resistance and has a longer service life. 6. Excellent plano steel wire springs are used, so that the fatigue resistance is better, the resilience is high, the switch switching motions are quick, and the switches are more sensitive and better in touch. 7. The optical keyboard is not subject to mechanical contact shaking, no noise occurs, the switch operation time has no delay, and the optical keyboard is more sensitive and more precise in operation.

A photoelectric keyboard is disclosed in the patent with a publication number of CN2301752Y. As shown in FIG. 1, the photoelectric keyboard comprises a key body arranged on a base, a returning spring arranged on the base and the key body, a shading plate connected between the key body and the returning spring, a light hole formed in the upper portion of the shading plate, a transmitting tube and a receiving tube, wherein the transmitting tube and the receiving tube are arranged on the two sides of the light hole. The problem that faults occur to the mechanical keyboard due to the fact that, the mechanical contacts are used frequently is solved, and the photoelectric keyboard has the advantages of reasonable part selection assembly, low failure rate and long service life and the like.

In addition, provided is a photoelectric keyboard with a publication number of CN2750570Y, of which the working principle is basically consistent with that of the photoelectric keyboard with the publication number of CN2301752Y. As shown in FIG. 2, the photoelectric keyboard is characterized in that the keyboard is provided with a key 11 and a photosensitive sensor 9 located on, the outer side of a through hole 6 formed in a vertical wall 4, wherein the middle of the key 11 is provided with a transparent body 1, and a non-transparent outer side wall 2 of the transparent body 1 can slide up and down along the vertical wall 4 of a cavity 12; the through hole 6 corresponds to the photosensitive sensor 9; a character display carrier 10 is positioned below the key 11; and the bottom of the key 11 is provided with elastic elements. The mode of setting the photoelectric keyboard is consistent with that of setting the ordinary keyboard. The shading or light transmission of the photosensitive sensor 9 is performed by pressing down or springing the key 11, and high level or low level is generated in a photoelectric input circuit, so that the problems of keyboard failure and the like caused by the reasons that conductive contacts of the conventional mechanical keyboard are affected by dust, and conductive rubber aging and contact oxidation occur are solved. However, the photoelectric keyboard in the prior art has the following shortcomings: 1. No optical design of a collimating and light-converging system is available between a transmitting tube and a receiving tube; due to the fact that the light emitting angle of the transmitting tube is large, when a shading plate (or a non-transparent outer side wall) and a light hole (or a through hole) are adopted, most of light is blocked, only a small part of light can pass through the light hole to be received by the receiving tube, and thus the photocoupling efficiency is low. When dust is accumulated in the light hole due to static electricity, the detection sensitivity of the receiving tube (or a photosensitive element) drops sharply. Moreover, since the light emitting angle of the transmitting tube is large and no collimating lens is adopted to narrow the beam angle of the transmitting tube, when the inner wall of the key is white or when the shading is not close due to a small size of the shading plate, stray light generated by the transmitting tube is large, so that the noise made by the receiving tube is obvious. 2. Part welded pins of an infrared ray (IR) tube (the transmitting tube) and a PT tube (the receiving tube) of the optical axis mechanical keyboard switch module structure are of a direct insert type structure, the welded pins need to be inserted into a printed circuit board (PCB) manually, and then the welded pins are welded and cut: the deviation of the welded pins insertion occurs easily in the welding production process, which leads to processes such as reworking maintenance; the production operation process is complex and is unsuitable for automatic welded pin insertion, the occupied labor is high, the production efficiency is low, and the manufacturing cost is high, 3. Direct insert type light-emitting diodes (LEDs) are adopted for a key cap, character lighting system of the pure mechanical shaft switch structure, the LEDs also need to be inserted into the PCB manually through plenty of labor and then are welded and cut; the production operation process is complex and unsuitable for automatic welded pin insertion, the material cost is high, the production efficiency is low, and the manufacturing cost is high. 4. Though the keyboard has a very long service life, the waterproof capability is poor, and users need to take much care when using the keyboard. 5. Keys of the optical axis keyboard are single in touch.

BRIEF SUMMARY OF THE INVENTION

An objective of the present invention is to overcome the defects in the prior art and provide a switch module of a photoelectric integrated mechanical shaft keyboard, which can greatly reduce labor and welding cost, has accuracy in welding positioning and is high in production efficiency and product quality stability.

In order to achieve the objective, the technical solution provided by the present invention is as follows:

A switch module of a photoelectric integrated mechanical shaft keyboard, comprising a casing and a key cap installed on the upper portion of the casing, and further comprising a driving device, a photoelectric switch, a movable optical module and a fixed optical module which are installed in the casing, wherein the movable optical module is installed on the driving device; the photoelectric switch comprises a PCB, a surface mounted (SMD) IR tube integrated on the PCB and an SMD PT tube, wherein the SMD IR tube is a surface mounted infrared ray diode, and the SMD PT tube is a surface mounted photoelectric sensor. By pressing down the key cap the driving device drives the movable optical module to move up and down to control the relative positions of the movable optical module and the fixed optical module. When light emitted by the SMD IR tube is coupled into the SMD PT tube, an optical path is connected, so that the photoelectric switch is turned on; and when the light emitted by the SMD IR tube cannot be coupled into the SMD PT tube, the optical path is disconnected, so that the photoelectric switch is turned off.

Compared with the prior art, the present invention has the beneficial effects that the integrated structure of the surface mounted infrared ray diode (SMD IR tube) and the surface mounted photoelectric sensor (SMD PT tube) is adopted; and by pressing down the key cap, the driving device drives the movable optical module to move up and down to control the relative positions of the movable optical module and the fixed optical module so as to turn on or turn off the photoelectric switch, The switch module structure of the photoelectric integrated mechanical shaft keyboard further comprises a key cap character lighting light guide system. The key cap character lighting light guide system comprises a surface mounted light-emitting diode (SMD LED) integrated on the PCB, a condensing lens, a light guide pillar and a lighting lens, wherein the condensing lens, the light guide pillar and the lighting lens ere sequentially arranged above the SMD LED. The lighting is performed on the key cap through the key cap character lighting light guide system, The switch module structure of the photoelectric integrated mechanical shaft keyboard has the following advantages:

1. The integrated structure of the SMD IR tube and the SMD PT tube is adopted, and the control over turning on or of the photoelectric switch is performed in combination with the relative positions of the movable optical module and the fixed optical module. Since a photoelectric part of the product structure of the present invention is in an SMD packaging mode, full automatic mounting and welding can be adopted, the labor and welding cost is greatly reduced, the welding positioning is precise, and the production efficiency and quality stability are improved.

2. A pure photoelectric device is adopted to control the switch to be turned on or off, a mechanical metal contact is not needed, and the switch is not subject to the influence of contact abrasion, oxidation and aging, is long in service life and can meet the requirements on high-frequency and long-time application.

3. The SMD LED is adopted to achieve key cap character lighting and light emitting. Since the SMD LED can be subject to full automatic mounting and welding, the labor cost, part cost and welding cost can be greatly reduced, the welding positioning is accurate, the production efficiency and quality stability are improved, and a direct insert type LED in the prior art does not need to be used.

4. The movable optical module and the fixed optical module are of a precise optical prism structure, and precise switch trigger position control can be achieved. The switch trigger position control precision is +/−0.20-0.60 mm in the prior art, the switch trigger position control precision of +/−0.10 mm can be achieved effectively in the present invention and is improved by 2-6 times compared with the trigger position precision in the prior art, and the keyboard touch quality stability is achieved.

5. The switch module is under the design of separation of electronic parts and the mechanical structure, can be independently assembled in the production process, and facilitates product after-sales service maintenance.

The switch module of the, photoelectric integrated mechanical shaft keyboard of the present invention is further described below in combination with drawings and embodiments.

DETAILED DESCRIPTION OF THE INVENTION

Figure 1:
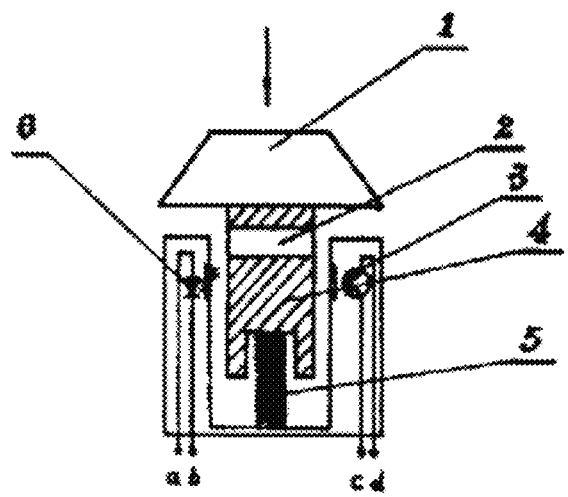
FIG. 1 is a structural schematic diagram of a photoelectric keyboard disclosed in a patent with the publication number of CN2301752Y.
Figure 2:
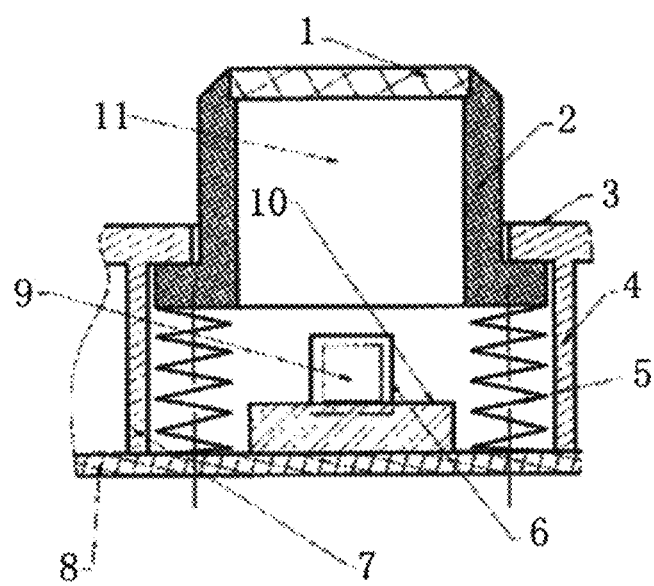
FIG. 2 is a structural schematic diagram of a photoelectric anti-peeping keyboard disclosed in a patent with the publication number of CN2750570Y.
Figure 3:
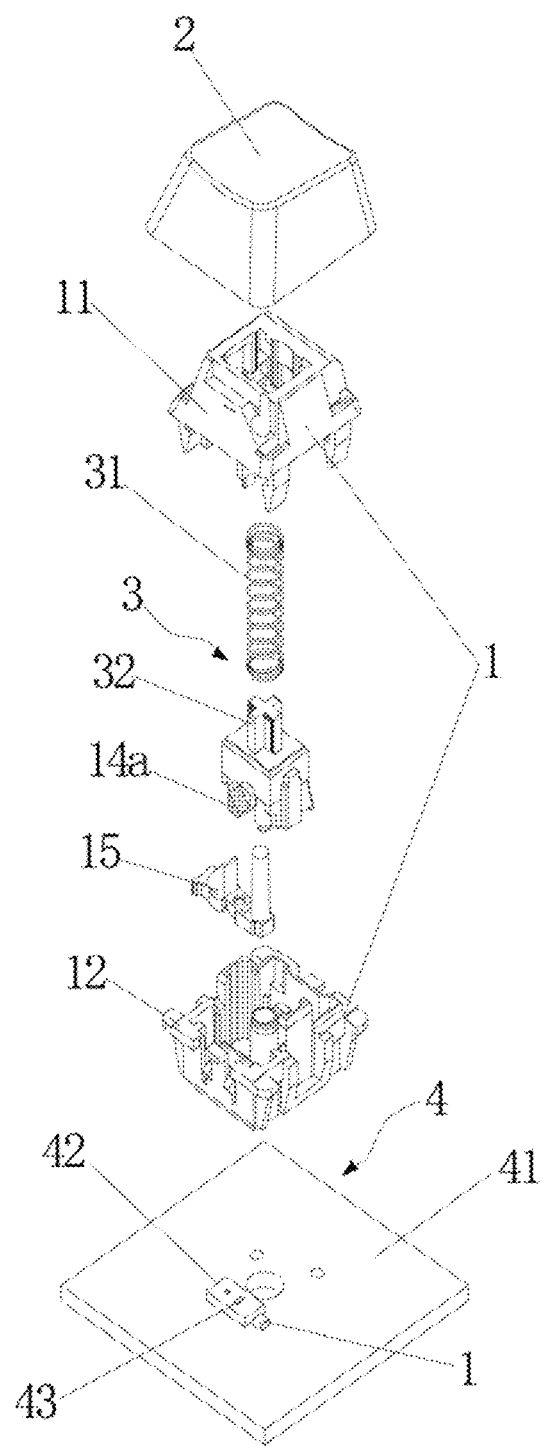
FIG. 3 is an equiaxial lateral decomposition structural diagram of Embodiment 1 of the switch module of the photoelectric integrated mechanical shaft keyboard of the present invention.
Figure 4:
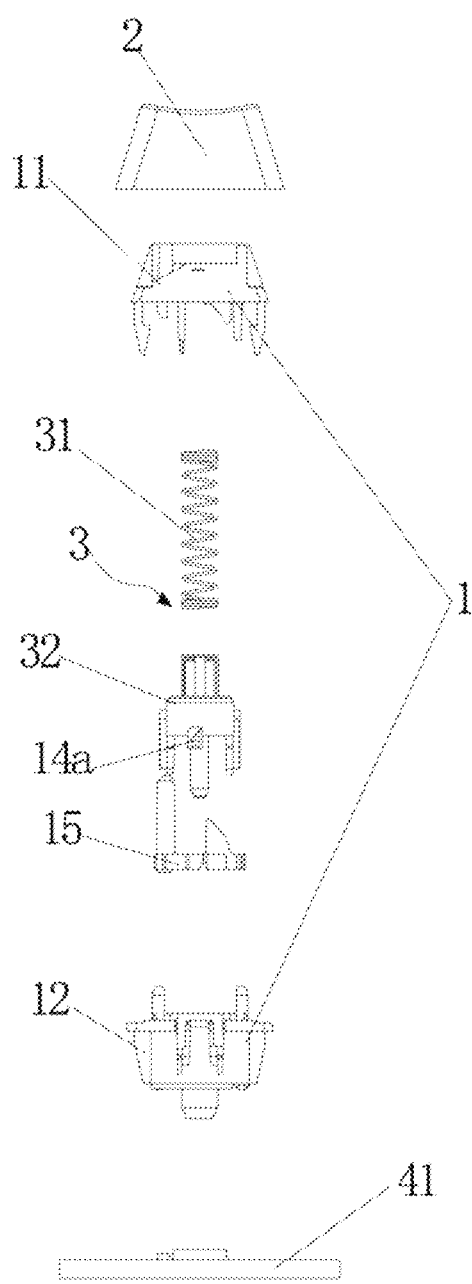
FIG. 4 is a front decomposition structural diagram of Embodiment 1 of the switch module of the photoelectric integrated mechanical shaft keyboard of the present invention.

The following is an optimal embodiment of a switch module of a photoelectric integrated mechanical shaft keyboard of the present invention, and is not used for limiting the protective scope of the present invention.

Embodiment 1:

Please refer to FIGS. 3 to 7 which illustrate a switch module of a photoelectric integrated mechanical shaft keyboard. The switch module comprises a casing 1 and a key cap 2 installed on the upper portion of the casing 1, wherein the casing 1 is formed by an upper casing 11 and a lower casing, and characters are engraved on the upper surface of the key cap 2. The switch module further comprises a driving device 3, a photoelectric switch 4, a movable optical module 14a and a fixed optical module 15 which are installed in the casing 1, wherein the movable optical module 14a is installed on the driving device 3; the photoelectric switch 4 comprises a PCB 41, an SMD IR tube 42 integrated on the PCB 41 and an SMD PT tube 43, wherein the SMD IR tube is a surface mounted infrared ray diode, and the SMD PT tube is a surface mounted photoelectric sensor. By pressing down the key cap 2, the driving device 3 drives the movable optical module 14a to move up and down to control the relative positions of the movable optical module 14a and the fixed optical module 15. When light emitted by the SMD IR tube 42 is coupled into the SMD PT tube 43, an optical; path is connected, so that the photoelectric switch 4 is turned on; and when the light emitted by the SMD IR tube 42 cannot be coupled into the SMD PT tube 43, the optical path is disconnected, so that the photoelectric switch 4 is turned off. The SMD IR tube 42 and the SMD PT tube 43 are integrally packaged or independently packaged in a split mode.

Preferably, the driving device 3 comprises a spring 31 and a key shaft 32 which are installed in the casing 1. One end of the spring 31 is in contact with the casing 1, and the other end of the spring 31 is connected with one end of the key shaft 32. The movable optical module 14a is fixed to the lower portion of the key shaft 32. When a user presses down the key cap 2 with his finger, the spring 31 is compressed downwards, and the key shaft 32 and the movable optical module 14a attached to the key shaft 32 move downwards along with the spring. When the movable optical module 14a is aligned with the fixed optical module 15 below the movable optical module 14a, the optical path is connected, and the light emitted by the SMD IR tube 42 is coupled into the SMD PT tube 43, so that a closed circuit is achieved. When the finger is loosened from the key cap, the spring 31 drives the key shaft 32 to spring upwards, the movable optical module 14a is separated from the fixed optical module 15, and the light emitted by the SMD IR tube 42 cannot be coupled into the SMD PT tube 43, so that an open circuit is achieved.

In this embodiment, the movable optical module 14a is an optical prism for controlling the photoelectric switch 4 to be turned on or off.

Figure 5:
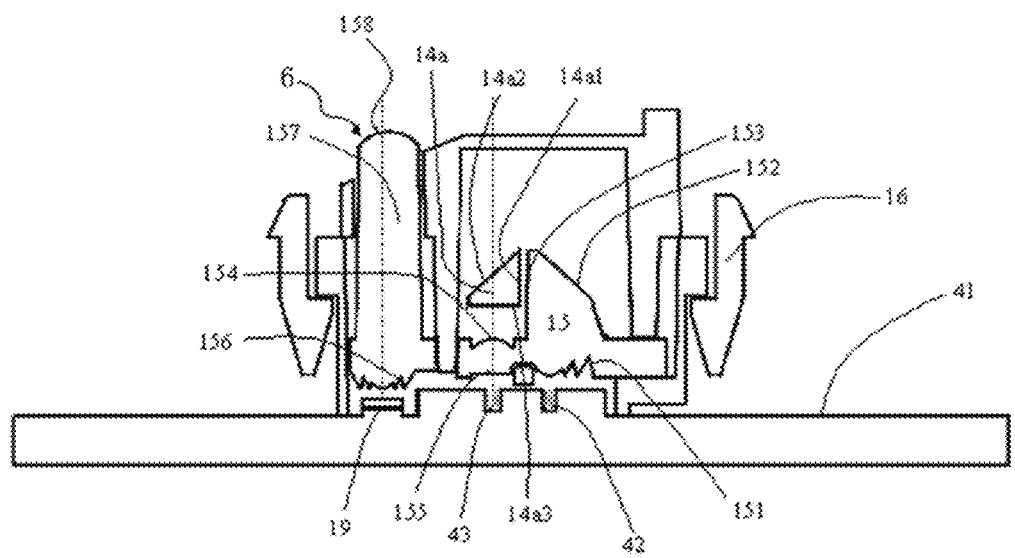
FIG. 5 is a sectional view of Embodiment 1 of switch module of the photoelectric integrated mechanical shaft keyboard of the present invention where a key cap, an upper casing and a spring are not installed.
Figure 6:
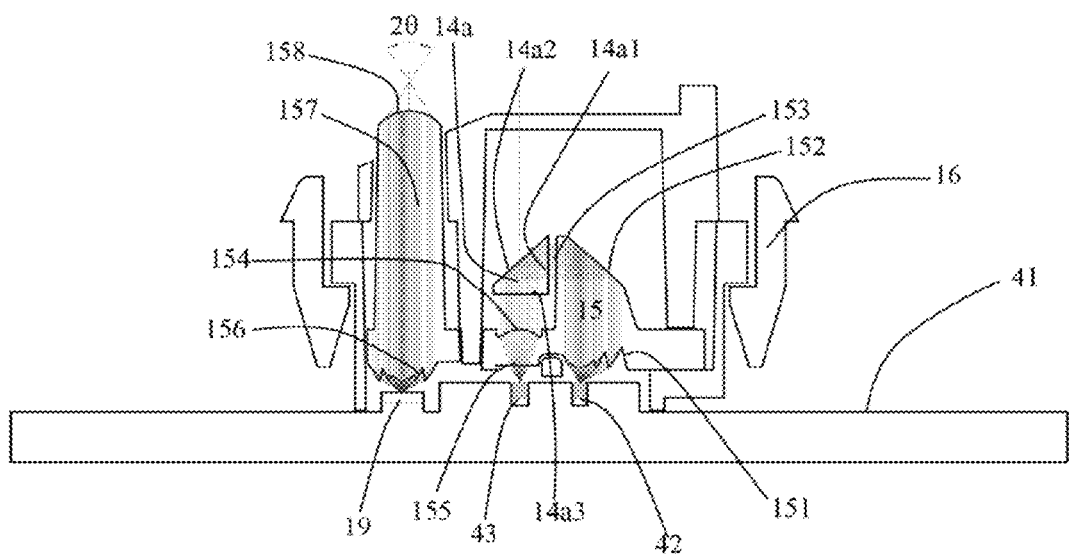
FIG. 6 is a design structure schematic diagram of Embodiment 1 of the switch module of the photoelectric integrated mechanical shaft keyboard of the present invention.

Furthermore, as shown in FIGS. 5 and 6 the movable optical module 14a is of a deflecting prism structure and is composed of a vertical plane 14a1, a total reflection inclined plane 14a2 and a bottom surface 14a3. The vertical plane 14a1 is a plane mirror and can also be a spherical surface or an aspheric surface; the total reflection inclined plane 14a2 inclined plane and can also be a mixed curved surface; the bottom surface 14a3 is a plane mirror and can also be a spherical surface or an aspheric surface. The fixed optical module 15 is of a deflecting prism structure and is composed of a collimating Fresnel lens 151, a total reflection inclined plane 152, a first plane mirror 153, a condensing lens 154 and a plane 155. The collimating Fresnel lens 151 is a Fresnel curved surface with different tooth intervals, or an aspheric surface or a multi-mixed curved surface; the condensing lens 154 is a spherical surface or an aspheric surface or an optical plane; and the optical plane 155 is a spherical surface or an aspheric surface, or a Fresnel surface, or a multi-mixed curved surface Light emitted by the SMD IR tube 42 is collimated through the collimating Fresnel lens 151 of the fixed optical module 15, and the collimated light enters the total reflection inclined plane 152 and is reflected and then emitted out of the first plane mirror 153. When the movable optical module 14a is aligned with the fixed optical module 15, light emitted out of the first plane mirror 153 completely enters the vertical plane 14a1 of the movable optical module 14a and is reflected through the total reflection inclined plane 14a2; the reflected collimated light is deflected downwards and emitted out of the bottom surface 14a3, enters the fixed optical module 15 again and is converged through the condensing lens 154, and then the light is emitted out of the plane 155 and is converged to the sensing surface of the SMD PT tube 43, so that current signals are generated.

Figure 7:
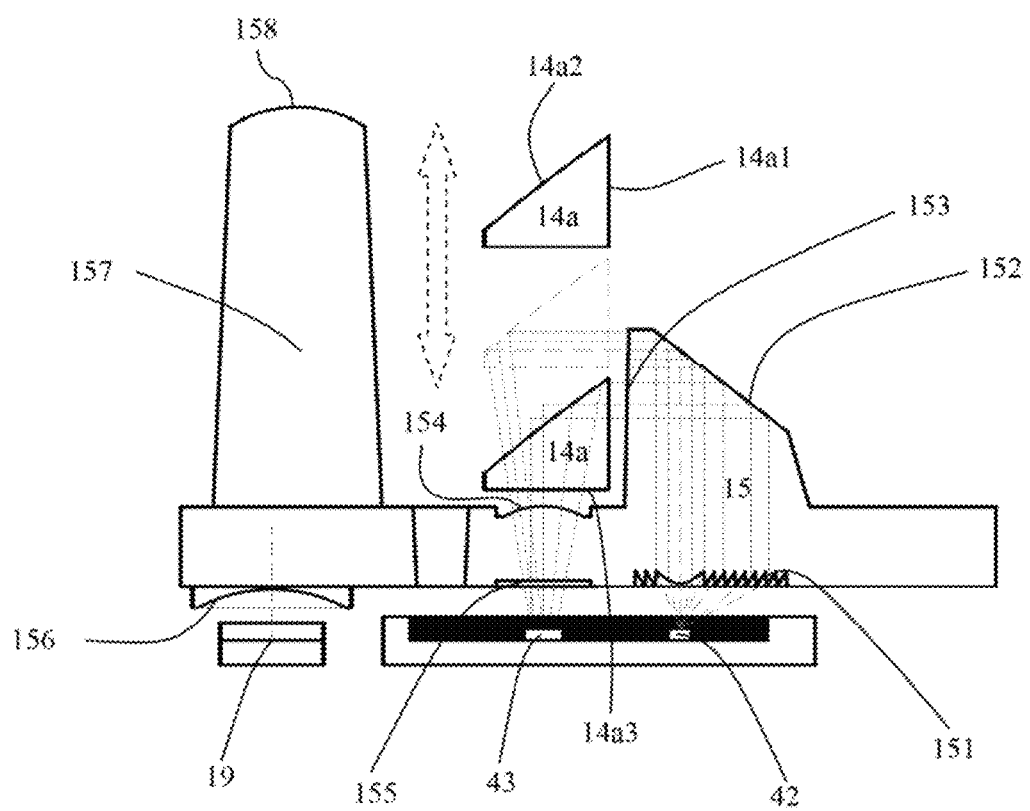
FIG. 7 is a schematic diagram of a movement position of a movable optical module of Embodiment 1 of the switch module of the photoelectric integrated mechanical shaft keyboard of the present invention.

Preferably, as shown in FIG. 7, according to the moving range of the movable optical module 14a, the upper position is the rising position when the spring 31 is in a loosened state and the key shaft 32 is static, and the optical path is in a disconnected state; when the key shaft 32 is pressed down to a critical position point for triggering the optical path to begin being connected, the optical path is in a connected state, the down-pressing moving stroke range of the key shaft 32 is 0.15-10 mm, and the optical path connection tolerance is +/−0.10 mm; the dotted line position at the middle of FIG. 7 is the middle position of the key shaft 32 and is a critical position point when the key shaft 32 is pressed down by a stroke of 2.00-2.20 mm to trigger the optical path to begin being connected, and the lower position of the key shaft 32 is the extreme position when the key shaft 32 is pressed down by 4.00 mm, that is, the optical path is in a connected state.

The switch module further comprises a character lighting light guide system 6 which is installed in the casing 1 and used for lighting characters on the surface of the key cap 2. The character lighting light guide system 6 is composed of an SMD LED 19 integrated on the PCB 41, a condensing lens 156, a light guide pillar 157 and a lighting lens 158, wherein the SMD LED 19 is a surface mounted light emitting diode; and the condensing lens 156, the light guide pillar 157 and the lighting lens 158 are sequentially positioned above the SMD LED 19. Light emitted by the SMD LED 19 is converged through the condensing lens 156 into the light guide pillar 157, and is refracted and output from the lighting lens 158 on the upper portion of the light guide pillar, to form emergent light with a beam angle of 2theta. According to the height of the key cap and the sizes of the characters, 2theta can be adjusted by appropriately adjusting the radian of the lighting lens 158; and on general conditions, 2theta ranges from 60 degrees to 160 degrees. Here, the condensing lens 156 is preferably a Fresnel lens. Since 2theta is large the condensing lens 156 and the lighting lens 158 can have other options, and can be planes and even concave surfaces, as shown in FIG. 7. Moreover, teeth of the collimating Fresnel lens 151 of the fixed optical module 15 can be designed into thick teeth according to the machining precision conditions, as shown in FIGS. 5 and 6, or thin teeth, as shown in FIG. 7.

The SMD IR tube 42, the SMD PT tube 43 and the SMD LED 19 are all provided with packaging silica gel.

Figure 8:
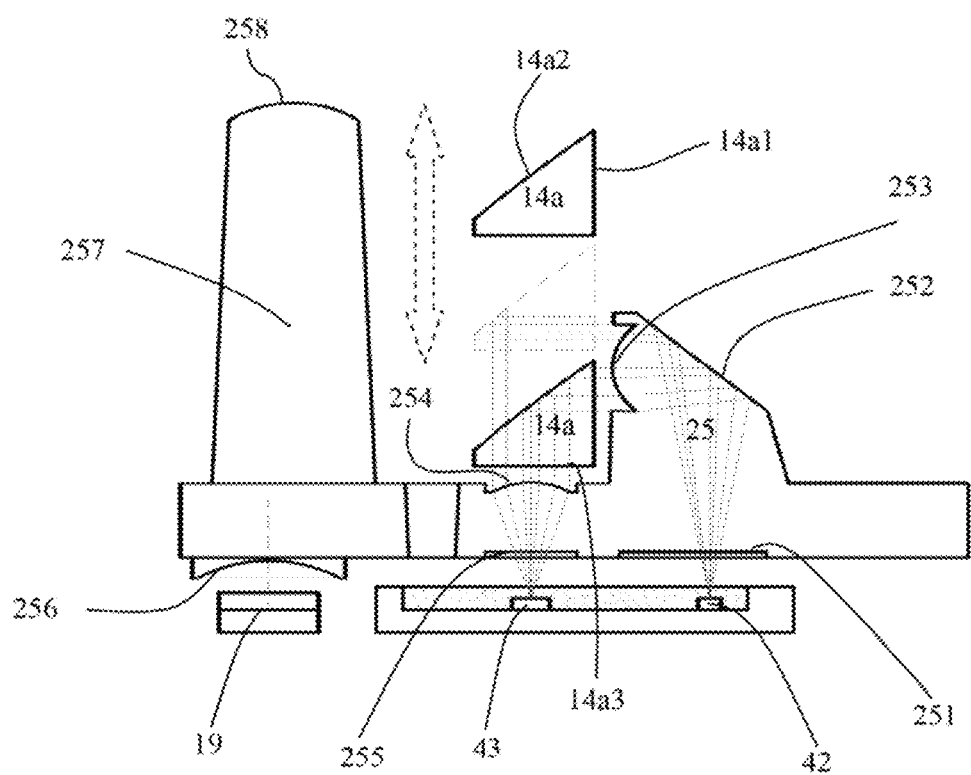
FIG. 8 is a design structure schematic diagram of Embodiment 2 of the switch module of the photoelectric integrated mechanical shaft keyboard of the present invention.

Embodiment 2:

As shown in FIG. 8, the fixed optical module 15 is a prism 25 which is of a collimating and deflecting lens structure, and the fixed optical module 15 is composed of a plane 251, an aspheric lens 253 and a total reflection inclined plane 252. In this embodiment, the movable optical module 14a and the key cap character lighting light guide system 6 for lighting characters on the surface of the key cap 2 are the same as those of Embodiment 1. The fixed optical module 15 is of different design. The collimating Fresnel lens 151 originally used for collimation is modified to be the plane 251, the first plane mirror 153 is modified to be the aspheric lens 253 which has a collimation effect, the total reflection inclined plane 252 is the same as that of Embodiment 1 and is kept unchanged. Since the aspheric processing is easier than the processing of the Fresnel lens and the requirements on precision of a processing cutter are low, the requirements on the process can be lowered in Embodiment 2, and thus the processing cost is reduced; however, since the focal length of the aspheric lens is long and the numerical aperture angle is small, the coupling efficiency is lower than that of Embodiment 1.

Figure 9:
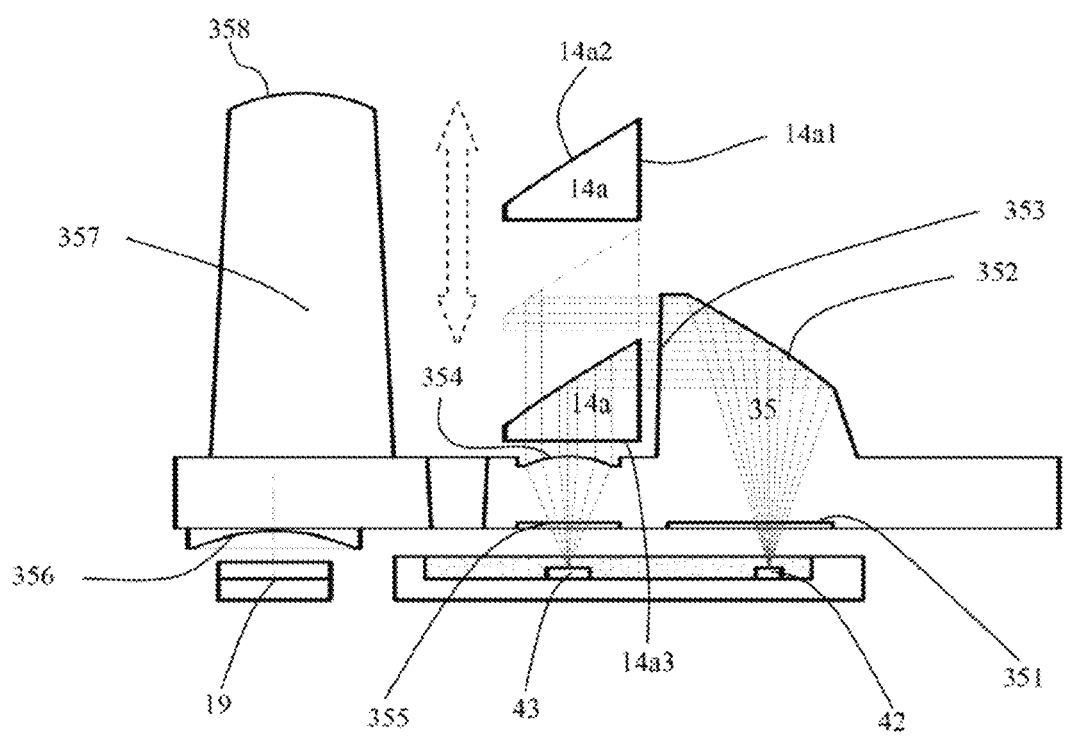
FIG. 9 is a design structure schematic diagram of Embodiment 3 of the switch module of the photoelectric integrated mechanical shaft keyboard of the present invention.

Embodiment 3:

As shown in FIG. 9, the fixed optical module 15 is a prism 35 which is of a collimating and deflecting lens structure. In this embodiment, the movable optical module 14a and the key cap character lighting light guide system 6 for lighting characters on the surface of the key cap 2 are the same as those of Embodiment 1. The fixed optical module 15 is of different design, An entering light surface 351 of the prism 35 is a plane and does not have a collimation effect on light entering from the SMD IR tube, a total reflection inclined plane 352 is an inclined free curved surface asymmetrical in the X-direction and the Y-direction, is an abaxial quadric surface or a double-taper coefficient curved surface and has an effect of optical path deflection and collimation and all light undergoing total reflection by the free curved surface 352 is emitted parallelly in the direction perpendicular to a vertical plane 353. When the movable optical module 14a is pressed down by a stroke of 2.00-2.20 mm from the static position of the key, the optical path is triggered to begin being connected. When the key is pressed down by a stroke range of 2.00-4 mm, the optical path is in a connected state. When the movable optical module 14a is completely aligned with a fixed module 35, parallel light emitted from the second plane mirror 353 completely enters the vertical plane 14a1 of the movable optical module and is reflected by the total reflection inclined plane 14a2, the reflected collimated light is deflected downwards and emitted out of a plane 14a3, enters the fixed module 35 again, is converged through a condensing lens 354 of the fixed module 35, and then the light is emitted out of the plane 355 and then converged to the sensing surface of the SMD PT tube, so that the strongest current signals are generated.

Figure 10:
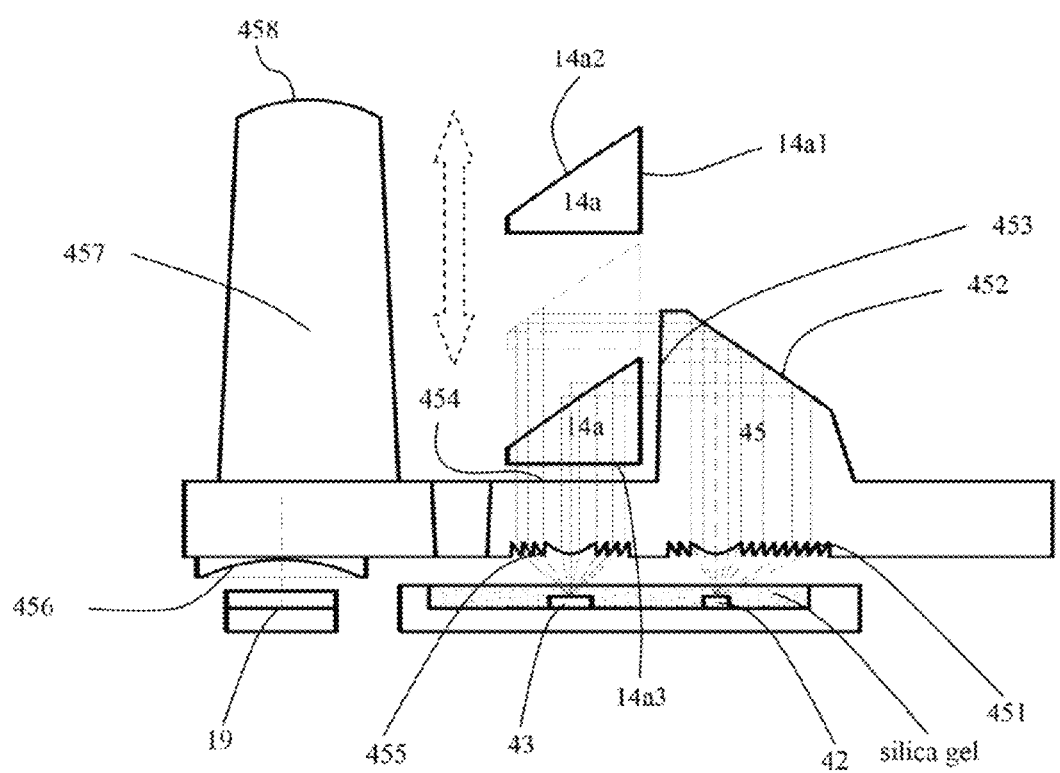
FIG. 10 is a design structure schematic diagram of Embodiment 4 of the switch module of the photoelectric integrated mechanical shaft keyboard of the present invention.

Embodiment 4:

As shown in FIG. 10, the fixed optical module 15 is a prism 45 which is of a collimating and deflecting lens stricture. In this embodiment, the movable optical module 14a and the key cap character lighting light guide system 6 for lighting characters on the surface of the key cap 2 are the same as those of Embodiment 1. The fixed optical module 15 is of different design. An entering light surface 451 of the prism 45 is a Fresnel collimating lens and has an effect of collimating light entering from the SMD IR tube, a total reflection inclined plane 452 is an inclined plane and has an effect of optical path deflection; and all light reflected by the total reflection inclined plane 452 is emitted parallelly in the direction perpendicular to a vertical plane 453. When the movable optical module 14a is pressed down by a stroke of 2.00-2.20 mm from the static position of the key, the optical path is triggered to begin being connected. When the key is pressed down by a stroke range of 2.00-5 mm, the optical path is in a connected state. When the movable optical module 14a is completely aligned with a fixed module 45, light emitted out of the vertical plane 453 completely enters the vertical plane 14a1 of the movable optical module and is reflected by the total reflection inclined plane 14a2 the reflected collimated light is deflected downwards and emitted out of the plane 14a3 and enters the fixed module 45 again. In this embodiment, an entering surface 454 is modified to be a plane, and 455 is modified to be a light-converging Fresnel lens and converges light to the sensing surface of an SMD PT tube 18, so that the strongest current signals are generated.

Figure 11:
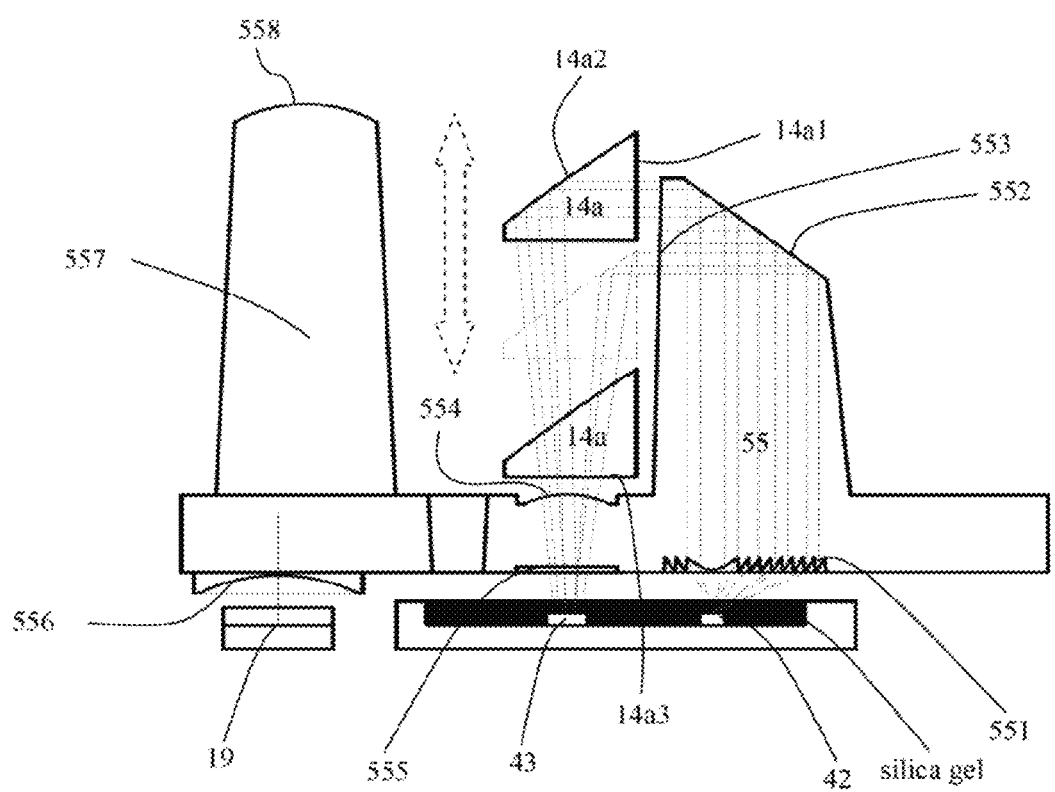
FIG. 11 is a design structure schematic diagram of Embodiment 5 of the switch module of the photoelectric integrated mechanical shaft keyboard of the present invention.

Embodiment 5:

In aforementioned Embodiments 1 to 4, when the key is loosened completely, the spring 31 is not compressed, and when the movable optical module 14a is located at the uppermost position, the optical path is in a disconnected state, and when the key shaft 32 is, pressed down by a stroke of 2.00-2.20 mm, the optical path is triggered to begin being connected. When the key shaft 32 is pressed down by a stroke range of 2.00-4 mm, the optical path is in a connected state. In this embodiment, the connected state and the disconnected state are in turn; the key is loosened completely, and when the movable optical module 14a is at the uppermost position, the optical path is in a disconnected state. When the key shaft 32 is pressed down by a stroke of 2.00-2.20 mm, the optical path is triggered to begin being disconnected. When the key shaft 32 is pressed down by a stroke range of 2.00-4 mm, the optical path is in a disconnected state. FIG. 11 shows the switch design principle of this embodiment, and all collimating, deflecting and converging systems of the switch are the same as those of Embodiment 1. As shown in FIG. 11, the fixed optical module 15 is a prism 55 which is of a collimating and deflecting lens structure. An entering surface 551 of the prism 55 is a collimating Fresnel lens, 552 is a total reflection inclined plane, 553 is a vertical plane, 554 is a light-converging aspheric lens, and 555 is a plane. The only difference is that the total reflection inclined plane 552 of the right, side prism is 2 mm higher than the total reflection inclined plane of Embodiment 1. When the key is loosened completely, parallel light emitted out of the vertical plane 553 just enters the movable optical module 14a, undergoes total reflection deflection and light convergence and then is converged into the SMD PT tube 43, so that current signals are generated, and the optical path is in a connected state. When the key is pressed down by a stroke of 2.00-2.20 mm, parallel light emitted out of the vertical plane 553 cannot enter the movable optical module 14a, no current signal generated by focusing spots occurs in the SMD PT tube 43, and the optical path is a disconnected state.

Figure 12:
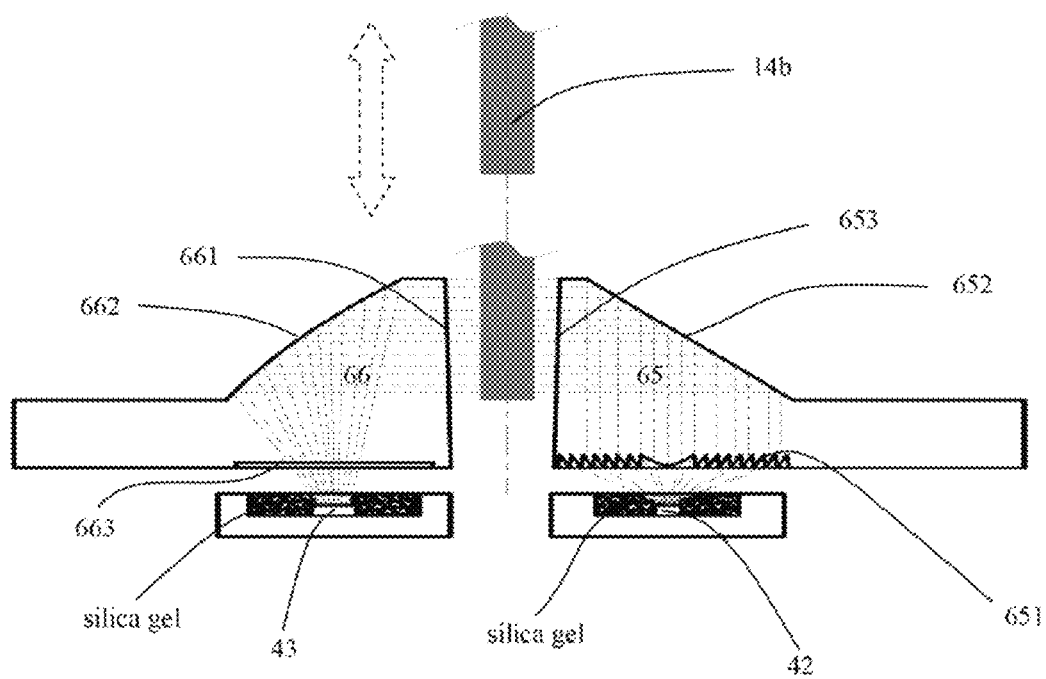
FIG. 12 is a design structure schematic diagram of Embodiment 6 of the switch module of the photoelectric integrated mechanical shaft keyboard of the present invention.

Embodiment 6:

The movable optical module in aforementioned Embodiments 1 to 5 is in a mode of a deflecting prism 14a, that is, the deflecting prism is controlled to move up and down, so that the optical path is connected or disconnected. In the following embodiment, the movable optical module is in a mode of a r mechanical shutter (a shading piece), and the optical path is connected or disconnected by moving the shading piece up and down. The switch design principle of this embodiment of the switch module structure of the photoelectric integrated mechanical shaft keyboard of the present invention is as shown in FIG. 12, the fixed optical module 15 comprises two prisms on the left side and the right side respectively, and the prisms are a prism 65 and a prism 66. The prism 65 is a collimating and deflecting prism system, a Fresnel lens 651 of the prism 65 first collimates light of the SMD IR tube 42, and then the light is reflected and deflected through a total reflection inclined plane 652 and emitted through a vertical plane 653. A mechanical shutter 14b is connected with the key shaft 32 and moves downwards or upwards when the spring 31 is pressed down or loosened, so that parallel light emitted out of the prism 65 is blocked or unblocked. When the key is loosened and the mechanical shutter 14b is positioned at the upper part, the shutter does not block parallel light emitted out of the prism 65, and at the time parallel light emitted out of a vertical plane 653 can enter the prism 66 on the left side. The prism 66 is a deflecting and light-converging prism system, and a total reflection inclined plane 662 of the prism 66 is a free curved surface asymmetric in the X-direction and the V-direction and has a deflecting and convergence effect. The concrete form of the total reflection inclined plane 662 can be an abaxial quadric surface or a double-taper coefficient curved surface. Through the total reflection inclined plane 662, incident light is subject to total reflection deflection and is converged into the SMD PT tube 43 below the prism, so that current signals are generated, and the optical path is in a connected state. When the key is pressed down, the mechanical shutter 14b is positioned at the lower part, the shutter blocks parallel light emitted out of the prism 65, at the time no focusing spot occurs in the SMD PT tube 43, so that no current signal occurs, and the optical path is a disconnected state.

Figure 13:
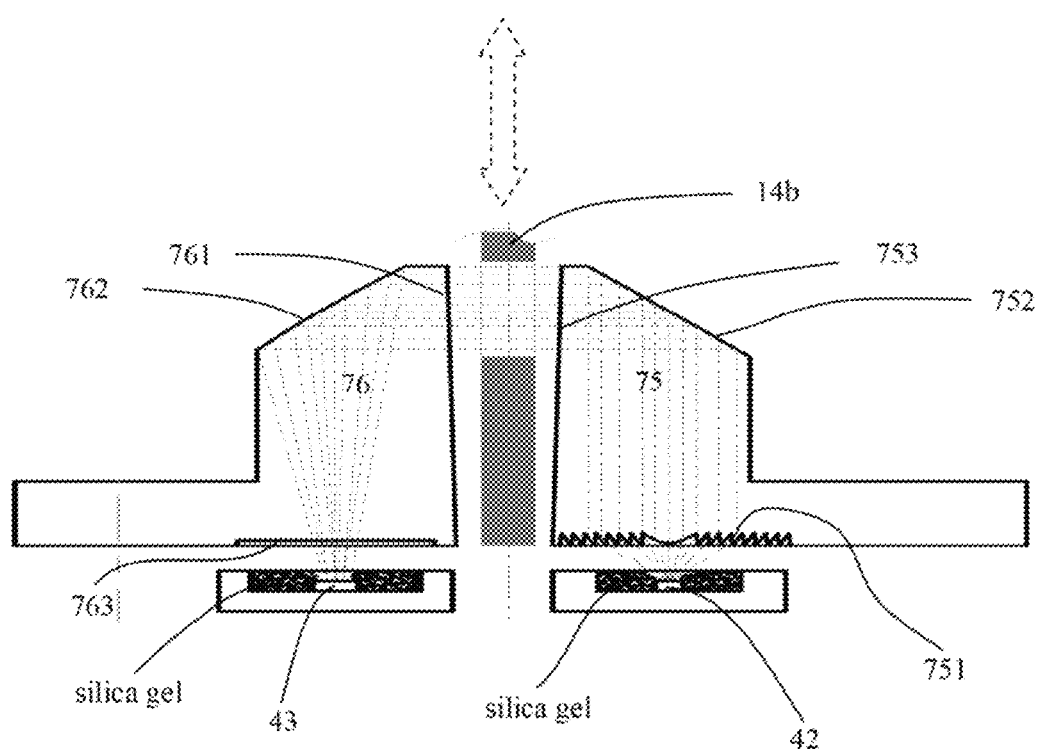
FIG. 13 is a design structure schematic diagram of Embodiment 7 of the switch module of the photoelectric integrated mechanical shaft keyboard of the present invention.

Embodiment 7:

In concrete Embodiment 6, when the key (namely the driving device 3) is loosened and the mechanical shutter is positioned at the uppermost part, the optical path is in a connected state. According to Embodiment 7 of the switch module structure of the photoelectric integrated mechanical shaft keyboard of the present invention, the connected state and the disconnected state are in turn, as shown in FIG. 13. Compared with Embodiment 6, the mode of the mechanical shutter is also adopted in Embodiment 7, and the structure of a prism deflecting and light-converging system of the mechanical shutter is basically the same as that of Embodiment 6. The fixed optical module 15 comprises two prisms on the left side and the right side respectively, and the prisms are a prism 75 and a prism 76. The prism 75 and the prism 76 are 2 mm higher than the prism 65 and a prism 66 of Embodiment 6. When the key is loosened completely and the movable optical module 14b is at the uppermost position, the mechanical shutter 14b blocks parallel light emitted out of a vertical plane 753, and the optical path is in a disconnected state. When the key is pressed down, the mechanical shutter 14b does not block the parallel light emitted out of the vertical plane 753, the parallel light enters the prism 76 on the left side, through convergence and deflection by a free curved surface 762, the light is converged into the SMD PT tube 43 below the prism, so that current signals are generated, and the optical path is triggered to be in a connected state.

Figure 14:
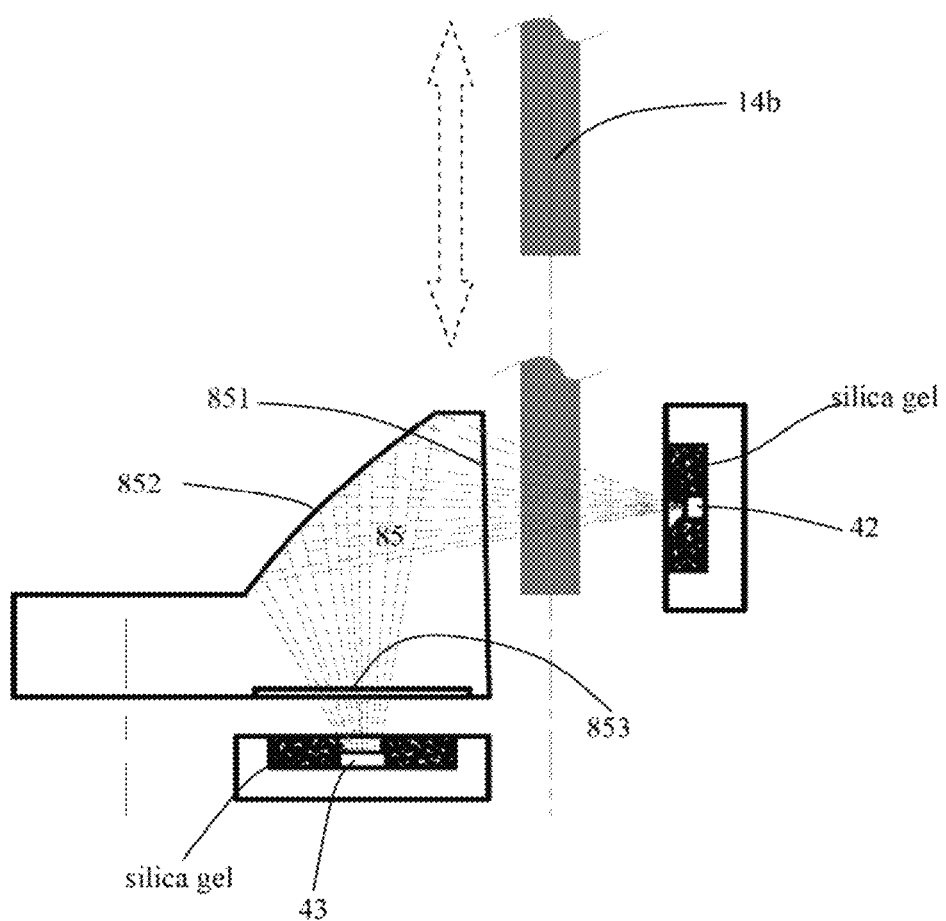
FIG. 14 is a design structure schematic diagram of Embodiment 8 of the switch module of the photoelectric integrated mechanical shaft keyboard of the present invention.

Embodiment 8:

In all the aforementioned embodiments, the SMD IR tube 42 and the SMD PT tube 43 are horizontally arranged on one PCB, and in actual application, one of the SMD IR tube 42 and the SMD PT tube 43 can be vertically placed. As shown in FIG. 14, the SMD IR tube 42 is erected to be placed on the right side, next to the SMD PT tube 43 is a mechanical shutter 14b, a free curved surface prism 85 is positioned on the left side of he mechanical shutter, and a free curved surface reflection surface 852 deflects light entering from the SMD IR tube and converges the light into the SMD PT tube below the prism. The optical path is disconnected or connected by controlling the mechanical shutter 14b to move up and down through the spring. The free curved surface reflection surface 852 is an abaxial quadric surface asymmetric in the X-direction and the Y-direction or a double-taper coefficient curved surface and meets the conditions that the emitting surface of the SMD IR tube and the receiving surface of the SMD PT tube are in conjugated object corresponding relationship relative to the curved surface.

Figure 15:
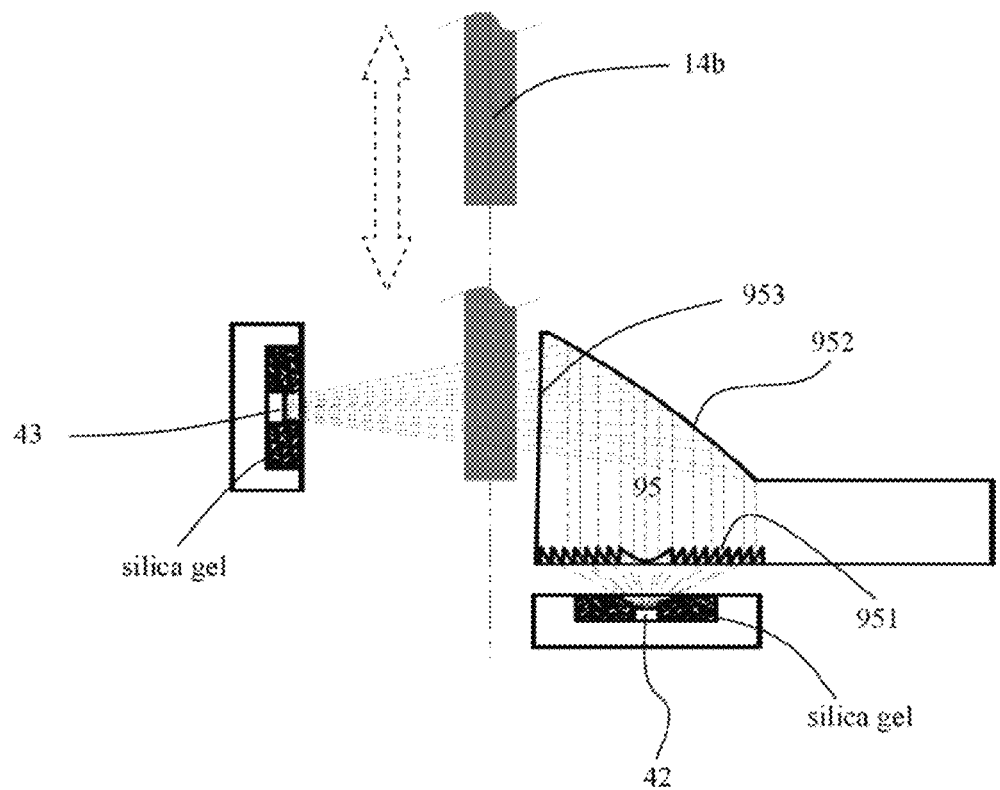
FIG. 15 is a design structure schematic diagram of Embodiment 9 of the switch module of the photoelectric integrated mechanical shaft keyboard of the present invention.

Embodiment 9:

In this embodiment, as shown in FIG. 15, the SMD PT tube 4 is erected to be placed on the left side, and next to the SMD PT tube 43 is a mechanical shutter 14b. A free curved surface prism 95 is positioned on the right side of the mechanical shutter, and a Fresnel collimating lens 951 is located at the position of the lower portion of the prism close to the SMD IR tube 42. The Fresnel collimating lens 951 causes light entering from the SMD IR tube 42 to be collimated and parallelly enter a free curved surface total reflection surface 952, the free curved surface total reflection surface 952 has effects of deflection and convergence and makes the parallelly entering light deflected and converged to the receiving surface of the SMD PT tube 43 on the left side. By controlling the mechanical shutter 14b to move up and down through the spring, the optical path can be disconnected or connected. The free curved surface total reflection surface 952 is an abaxial quadric surface asymmetric in the X-direction and the Y-direction or a double-taper coefficient curved surface.

Figure 16:
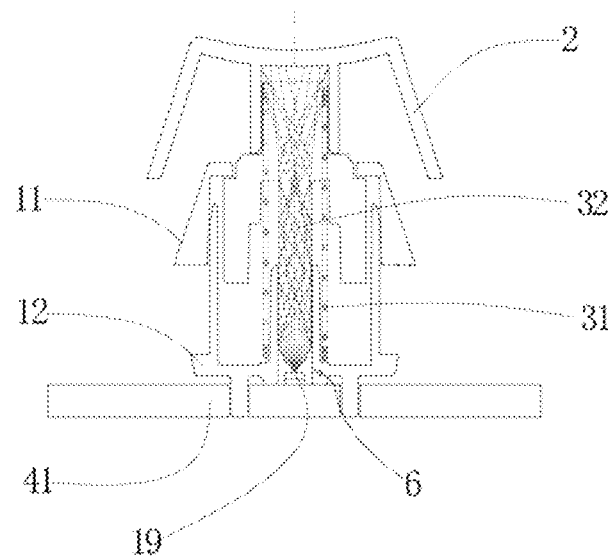
FIG. 16 is a structural schematic diagram of another character lighting light guide system of the switch module of the photoelectric integrated mechanical shaft keyboard of the present invention.

Embodiment 10:

In all the aforementioned concrete embodiments, the light source of SMD LED 19 (in a single color or in red, green and blue) of a character lighting light guide system 6 is located on the PCB 41, and the light emitted by the light source is converged into the light guide pillar through the condensing lens and deflected and output through a lighting lens above the light guide pillar, to form emergent light with a beam angle of 2theta, so as to light characters on the key cap 2. This embodiment provides another character lighting light guide system. As shown in FIG. 16, the light source of the SMD LED 19 (in a single color or in red, green and blue) is arranged on the PCB 41 and located at the central position of the lower portion of the key shaft 32, and a central shaft of the key shaft 32 is made of a transparent or semitransparent material, so that the central shaft of the key shaft 32 becomes a light guide tube. Light emitted out of the SMD LED 19 is directly coupled into the key shaft 32, the key shaft 32 and the light guide tube mix the incident light and conduct the light upwards, and the light is output from the upper portions of both the key shaft 32 and the light guide tube, so as to light the key cap 2 above the key shaft 32 and the light guide tube.

The foregoing embodiments re optimal embodiments of the present invention, but the embodiments of the present invention are not subject to the foregoing embodiments. Any other variation, modification, replacement, combination and simplicity without departing from the spiritual essence and principle of the present invention should be equivalent substitute mode and should be included in the protective scope of the present invention.

What is claimed is:

1. A switch module of a photoelectric integrated mechanical shaft keyboard, comprising:
    a casing and a key cap installed on an upper portion of the casing, wherein the switch module further comprises a driving device, a photoelectric switch, a movable optical module and a fixed optical module which are installed in the casing;
    the driving device comprises a spring and a key shaft which are installed in the casing;
    one end of the spring is in contact with the casing and another end of the spring is connected with one end of the key shaft;
    the movable optical module is an optical prism installed at a lower portion of the key shaft of the driving device for controlling the photoelectric switch to be turned on or off;
    the photoelectric switch comprises a Printed circuit board (PCB), a surface mounted infrared ray diode (SMD IR) tube integrated on the PCB and a surface mounted photoelectric sensor (SMD PT) tube by pressing down the key cap, the driving device drives the movable optical module to move up and down to control a relative positions of the movable optical module and the fixed optical module;
    when light emitted by the SMD IR tube is coupled into the SMD PT tube by travelling through the fixed optical module and the movable optical module, an optical path is connected, so that the photoelectric switch is turned on; and
    when the light emitted by the SMD IR tube cannot be coupled into the SMD PT tube, the optical path is disconnected, so that the photoelectric switch is turned off.

2. The switch module of the photoelectric integrated mechanical shaft keyboard according to claim 1, wherein the movable optical module is of a deflecting prism structure and is composed of a vertical plane, a total reflection inclined plane and a bottom surface; the fixed optical module is of the deflecting prism structure and is composed of a collimating Fresnel lens, the total reflection inclined plane, a first plane mirror, a condensing lens and an optical plane.

3. The switch module of the photoelectric integrated mechanical shaft keyboard according to claim 2, wherein the light emitted by the SMD IR tube is collimated through the collimating Fresnel lens of the fixed optical module, and the collimated light enters the total reflection inclined plane of the fixed optical module and is reflected and then emitted out of the first plane mirror of the fixed optical module;

when the movable optical module is aligned with the fixed optical module, the light emitted out of the first plane mirror of the fixed optical module completely enters the vertical plane of the movable optical module and is reflected through the total reflection inclined plane of the movable optical module;

the reflected collimated light is deflected downwards and emitted out of the bottom surface, enters the fixed optical module again and is converged through the condensing lens and then emitted out of the optical plane of the fixed optical module and then is converged to a sensing surface of the SMD PT tube, so that current signals are generated.

4. The switch module of the photoelectric integrated mechanical shaft keyboard according to claim 2, wherein the vertical plane is a plane mirror or a spherical surface or an aspheric surface; the total reflection inclined plane of the movable optical module is an inclined plane or a mixed curved surface: and the bottom surface is a plane mirror or a spherical surface or an aspheric surface.

5. The switch module of the photoelectric integrated mechanical shaft keyboard according to claim 1, wherein according to a moving range of the movable optical module, an upper position which the movable optical module moves to is a rising position when the spring is in a loosened state and the key shaft is static, and the optical path is in a disconnected state; when the key shaft is pressed down to a critical position point for triggering the optical path to begin being connected, the optical path is in a connected state, a down-pressing moving stroke range of the key shaft is 0.15-10 mm, and an optical path connection tolerance is +/−0.10 mm.

6. The switch module of the photoelectric integrated mechanical shaft keyboard according to claim 1, wherein the fixed optical module is composed of a first plane mirror, a collimating lens, a condensing lens, an optical plane and a total reflection inclined plane; the collimating lens is a Fresnel curved surface with different tooth intervals, or an aspheric surface or a multi-mixed curved surface; the condensing lens is a spherical surface or an aspheric surface or an optical plane; and the optical plane is a spherical surface or an aspheric surface, or a Fresnel surface, or a multi-mixed curved surface.

7. The switch module of the photoelectric integrated mechanical shaft keyboard according to claim 1, wherein the surface mounted infrared ray diode (SMD IR) tube and the surface mounted photoelectric sensor (SMD PT) tube are integrally packaged or independently packaged in a split mode.

8. The switch module of the photoelectric integrated mechanical shaft keyboard according to claim 1, wherein the fixed optical module is of a collimating and deflecting lens structure and is composed of a plane, an aspheric lens and a total reflection inclined plane.

9. The switch module of the photoelectric integrated mechanical shaft keyboard according to claim 1, wherein the fixed optical module is of a collimating and deflecting lens structure and is composed of a plane entering light surface, a total reflection free curved surface and a second plane mirror; the total reflection free curved surface is an abaxial quadric surface or a double-taper coefficient curved surface and has an effect of optical path deflection and collimation, and all light reflected by the total reflection free curved surface is emitted in a direction perpendicular to the second plane mirror.

10. The switch module of the photoelectric integrated mechanical shaft keyboard according to claim 1, wherein the fixed optical module is of a collimating and deflecting lens structure and is composed of a Fresnel collimating lens, a total reflection inclined surface and a vertical plane.

11. The switch module of the photoelectric integrated mechanical shaft keyboard according to claim 1, further comprising a character lighting light guide system which is installed in the casing and used for lighting characters on a surface of the key cap; the character lighting light guide system is composed of a surface mounted light-emitting diode (SMD LED) integrated on the PCB, a condensing lens, a light guide pillar and a lighting lens, wherein the condensing lens, the light guide pillar and the lighting lens are sequentially positioned above the SMD LED.

12. The switch module of the photoelectric integrated mechanical shaft keyboard according to claim 11, wherein light emitted by the SMD LED is converged through the condensing lens into the light guide pillar and is refracted and output from the lighting lens on an upper portion of the light guide pillar; an angle of the light emitted out of the lighting lens is between 60 degrees and 160 degrees.

13. The switch module of the photoelectric integrated mechanical shaft keyboard according to claim 1, wherein when the key cap is loosened completely and the movable optical module is located at an uppermost position, the optical path is in a connected state; when the key shaft is pressed down by a stroke of 2.00-2.20 mm, the optical path is triggered to begin being disconnected; when the key shaft is pressed down by a stroke range of 2.00-5 mm, the optical path is in a disconnected state.

14. The switch module of the photoelectric integrated mechanical shaft keyboard according to claim 1, further comprising a character lighting light guide system which is installed in the casing and used for lighting characters on a surface of the key cap; the character lighting light guide system has the following structure: a SMD LED is placed at a central position of the lower portion of the key shaft, and a central shaft of the key shaft is made of a transparent or semitransparent material, so that the central shaft becomes a light guide tube; light emitted out of the SMD LED is directly coupled into the key shaft; the key shaft and the light guide tube mix the light emitted out of the SMD LED and conduct the light emitted out of the SMD LED upwards, and the light emitted out of the SMD LED is output from upper portions of both the key shaft and the light guide tube.

* * * * *